(12) United States Patent
Fan et al.

(10) Patent No.: US 12,224,372 B2
(45) Date of Patent: Feb. 11, 2025

(54) LIGHT-EMITTING DIODE CHIP

(71) Applicant: KAISTAR Lighting (Xiamen) Co., Ltd., Xiamen (CN)

(72) Inventors: Benjie Fan, Xiamen (CN); Hung-Chih Yang, Xiamen (CN); Shuen Ta Teng, Xiamen (CN)

(73) Assignee: BRIDGELUX OPTOELECTRONICS (XIAMEN) CO., LTD., Xiamen (CN)

( * ) Notice: Subject to any disclaimer, the term of this patent is extended or adjusted under 35 U.S.C. 154(b) by 398 days.

(21) Appl. No.: 17/676,265

(22) Filed: Feb. 21, 2022

(65) Prior Publication Data

US 2022/0278251 A1 Sep. 1, 2022

(30) Foreign Application Priority Data

Feb. 26, 2021 (CN) .......................... 202110219720.7

(51) Int. Cl.
*H01L 33/04* (2010.01)
*H01L 25/075* (2006.01)
*H01L 33/06* (2010.01)
*H01L 33/08* (2010.01)
*H01L 33/32* (2010.01)

(52) U.S. Cl.
CPC .......... *H01L 33/04* (2013.01); *H01L 25/0753* (2013.01); *H01L 33/06* (2013.01); *H01L 33/08* (2013.01); *H01L 33/325* (2013.01)

(58) Field of Classification Search
CPC .......... H01L 33/04; H01L 33/08; H01L 33/06; H01L 33/325
See application file for complete search history.

(56) References Cited

U.S. PATENT DOCUMENTS 7,279,717 B2 * 10/2007 Yamada .................. H01L 33/32
257/97
9,123,851 B2 * 9/2015 Goda ...................... H01L 33/06
9,711,682 B2 * 7/2017 Han ........................ H01L 33/06
(Continued)

FOREIGN PATENT DOCUMENTS

CN 107170866 A 9/2017
CN 112271239 A 1/2021

*Primary Examiner* — David Vu
*Assistant Examiner* — Brandon C Fox
(74) *Attorney, Agent, or Firm* — Hemisphere Law, PLLC; Zhigang Ma (57) ABSTRACT

A light-emitting diode chip is provided and includes: a first doping-type semiconductor layer, a second doping-type semiconductor layer, and a multiple quantum well structure layer formed between the first doping-type semiconductor layer and the second doping-type semiconductor layer. The multiple quantum well structure layer includes multiple first quantum well structures and at least one second quantum well structure stacked in a distance direction of the first and second doping-type semiconductor layers. The first quantum well structures are used to emit first color light, and the at least second well structure is used to emit second color light different from the first color light. A total number of well layer of the at least one second quantum well structure is $\frac{1}{15}$~$\frac{1}{5}$ of a total number of well layer of the first quantum well structures located between the at least one second quantum well structure and the second doping-type semiconductor layer.

17 Claims, 6 Drawing Sheets

(56) References Cited

U.S. PATENT DOCUMENTS

2006/0049415 A1\* 3/2006 Liao .................. H01L 33/08
                                                    257/97
2018/0351039 A1\* 12/2018 Kim .................. H01L 33/325
2023/0275074 A1\* 8/2023 Lau .................. H01L 27/156
                                                    257/72

\* cited by examiner

LIGHT-EMITTING DIODE CHIP

FIELD OF THE DISCLOSURE

The disclosure relates to the technical field of solid-state light-emitting devices, and more particularly to a light-emitting diode chip.

BACKGROUND OF THE DISCLOSURE

The current display screen market is mainly composed of three parts: LCD display screen, OLED display screen and LED display screen. Display effects of the LCD display screen and the OLED display screen are better, and the LED display screen currently only has a type of direct LED display and a type of mini-LED backlight plus QD (quantum dot) filters being comparable thereto. A characteristic of the LED direct display and the mini-LED backlight plus QD filters is that a spectrum of the three primary colors of RGB is narrow enough (i.e., a full width at half maximum is small), which is currently difficult to achieve by phosphors, or at least not achieved by green phosphors. Moreover, the mini-LED backlight plus QD filter is not yet mature, its brightness is poor and its reliability has not yet been satisfactorily ensured.

Therefore, how to not only meet requirements of brightness and reliability, but also achieve narrow enough spectrum of emitted light, is a technical problem needed to be solved.

SUMMARY OF THE DISCLOSURE

Accordingly, in order to overcome at least some of deficiencies and shortcomings in the prior art, embodiments of the disclosure provide a light-emitting diode (LED) chip with multiple (i.e., more than one) peak wavelengths in its emission spectrum.

Specifically, an embodiment of the disclosure provides a light-emitting diode chip including: a first doping-type semiconductor layer, a second doping-layer semiconductor layer, and a multiple quantum well (MQW) structure layer formed between the first doping-type semiconductor layer and the second doping-type semiconductor layer. The MQW structure layer includes a plurality of (i.e., more than one) first quantum well structures and at least one second quantum well structure stacked in a distance direction between the first doping-type semiconductor layer and the second doping-type semiconductor layer. The plurality of first quantum well structures are configured (i.e., structured and arranged) to emit first color light, and the at least one second quantum well structure is configured to emit second color light different from the first color light. A total number of well layer of the at least one second quantum well structure is $1/15 \sim 1/5$ of a total number of well layer of first quantum well structures located between the at least one second quantum well structure and the second doping-type semiconductor layer in the plurality of first quantum well structures.

In an embodiment of the disclosure, the first doping-type semiconductor layer is an N-type semiconductor layer, the second doping-type semiconductor layer is a P-type semiconductor layer, the plurality of first quantum well structures are a plurality of blue-light quantum well structures and configured to emit blue light, and the at least one second quantum well structure is at least one green-light quantum well structure and configured to emit green light.

In an embodiment of the disclosure, an emission spectrum of the light-emitting diode chip includes a first peak in a blue wavelength band and a second peak in a green wavelength band, an intensity of the second peak is 20%~60% of an intensity of the first peak, a wavelength of the first peak is in a range of 430~470 nm, and a wavelength of the second peak is in a range of 510~550 nm.

In an embodiment of the disclosure, for each of the at least one green-light quantum well structure, a thickness of barrier layer is 1~4 times of a thickness of well layer; and for each of the plurality of blue-light quantum well structures, a thickness of barrier layer is 1~4 times of a thickness of well layer.

In an embodiment of the disclosure, a thickness of well layer of each of the at least one green-light quantum well structure is equal to a thickness of well layer of each of the plurality of blue-light quantum well structures, and a thickness of barrier layer of each of the at least one green-light quantum well structure is equal to a thickness of barrier layer of each of the plurality of blue-light quantum well structures.

In an embodiment of the disclosure, a thickness of barrier of each of at least one of blue-light quantum well structures located between the at least one green-light quantum well structure and the P-type semiconductor layer in the plurality of blue-light quantum well structures is greater than a thickness of barrier layer of each of the at least one green-light quantum well structure.

In an embodiment of the disclosure, a thickness of barrier of each of at least one of blue-light quantum well structures located between the at least one green-light quantum well structure and the P-type semiconductor layer in the plurality of blue-light quantum well structures is smaller than a thickness of barrier layer of each of the at least one green-light quantum well structure.

In an embodiment of the disclosure, the at least one green-light quantum well structure is a plurality of green-light quantum well structures, and the plurality of quantum well structures are stacked and arranged adjacent to each other in the distance direction.

In an embodiment of the disclosure, a band gap of each of the plurality of first quantum well structures is in a range of 2.64~2.88 eV, a band gap of each of the at least one second quantum well structure is in a range of 2.25~2.43 eV, a peak wavelength of the first color light is smaller than a peak wavelength of the second color light, and a peak intensity of the first color light is greater than a peak intensity of the second color light.

In an embodiment of the disclosure, the light-emitting diode chip further includes: a substrate, a buffer layer disposed on the substrate, a first electrode and a second electrode. The first doping-type semiconductor layer, the MQW structure layer and the second doping-type semiconductor layer are sequentially epitaxially grown on a side of the buffer layer facing away from the substrate. The first electrode is disposed on the first doping-type semiconductor layer and in ohmic contact with the first doping-type semiconductor layer. The second electrode is disposed on the second doping-type semiconductor layer and in ohmic contact with the second doping-type semiconductor layer. The MQW structure layer is an InGaN/GaN MQW structure layer, and an indium concentration in a well layer of each of the at least one second quantum well structure is greater than an indium concentration in a well layer of each of the plurality of first quantum well structures.

In summary, in the embodiments of the disclosure, the MQW structure layer is designed with the quantum well structures of different band gaps, i.e., a plurality of first quantum well structures and at least one second quantum well structure stacked in the distance direction between the first doping-type semiconductor layer and the second doping-type semiconductor layer, and the total number of well layer of the at least one second quantum well structure is set to be $1/15 \sim 1/5$ of the total number of well layer of first quantum well structures located between the at least one second quantum well structure and the second doping-type semiconductor layer in the plurality of first quantum well structures. As a result, the light-emitting diode chip associated with any one of the above embodiments of the disclosure can emit multiple, e.g., two kinds of color lights of different wavelengths simultaneously, for example emit blue light and green light simultaneously; and the blue light and green light combined with red phosphor can meet requirements such as brightness, reliability and narrow emission spectrum required by a display screen.

BRIEF DESCRIPTION OF THE DRAWINGS

In order to more clearly illustrate technical solutions of embodiments of the disclosure, drawings used in the description of the embodiments will be briefly described below. Apparently, the drawings described below are merely some embodiments of the disclosure, and those skilled in the art can obtain other drawings based on these drawings without creative effort.

DETAILED DESCRIPTION OF EMBODIMENTS

In order to make objectives, technical solutions and advantages of embodiments of the disclosure more clear, the technical solutions in the embodiments of the disclosure will be described clearly and completely with reference to accompanying drawings. Apparently, the described embodiments are only some of embodiments of the disclosure, rather than all of embodiments of the disclosure. Based on the described embodiments of the disclosure, all other embodiments obtained by those skilled in the art without creative effort shall fall within the protection scope of the disclosure.

It is noted that all directional indications (such as up, down, left, right, front, rear, . . . ) in the embodiments of the disclosure are only used to explain relative positional relationships and motions of various components in a specific posture (as shown in the accompanying drawings). If the specific posture changes, the directional indications will also change accordingly.

In the embodiments of the disclosure, terms "first", "second", etc. are used only for descriptive purposes, and cannot be understood as indicating or implying their relative importance or implicitly indicating the number/amount of indicated technical features. Thus, a feature defined with "first" and "second" may explicitly or implicitly include at least one the feature.

Figure 1:
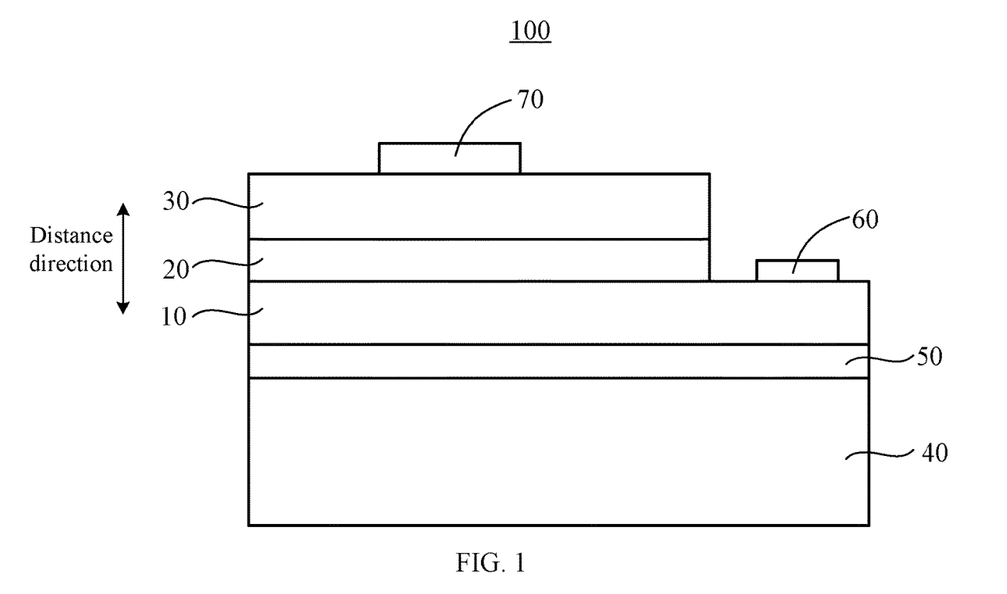
FIG. 1 is a schematic structural view of a light-emitting diode according to an embodiment of the disclosure.

Referring to FIG. 1, an embodiment of the disclosure provides a light-emitting diode chip 100. The light-emitting diode chip 100 mainly includes a first doping-type semiconductor layer 10, a multiple quantum well (MQW) structure layer 20, and a second doping-type semiconductor layer 30. Typically, the light-emitting diode chip 100 in the illustrated embodiment may further include a substrate 40, a buffer layer 50, a first electrode 60 and a second electrode 70.

Generally, a conventional light-emitting diode chip can only emit single-color light with a certain full width at half maximum (FWHM). For example, a blue light-emitting diode chip can only emit blue light, and a green light-emitting diode chip can only emit green light. According to the study of the inventors of the disclosure, this is because well layers in the epitaxial MQW structure layer of the conventional light-emitting diode chip are designed so that each quantum well structure has the same band gap, taking an InGaN/GaN MQW structure layer as an example, that is to say, each quantum well structure has the same indium (In) concentration.

The light-emitting diode chip 100 in the illustrated embodiment is designed with quantum well structures of different band gaps in the MQW structure layer 20, that is, a quantum well structure capable of emitting first color light and a quantum well structure capable of emitting second color light different from the first color light, and thus an emission spectrum of the light-emitting diode chip 100 has multiple peak wavelengths.

Specifically, the MQW structure layer 20 is formed between the first doping-type semiconductor layer 10 and the second doping-type semiconductor layer 30. The MQW structure layer 20 includes multiple first quantum well structures and at least one second quantum well structure stacked in a distance direction between the first doping-type semiconductor layer 10 and he second doping-type semiconductor layer 30. The multiple first quantum well structures are configured (i.e., structured and arranged) for emitting first color light, the at least one second quantum well structure is configured for emitting second color light different from the first color light in color, and a total number of well layer of the at least one second quantum well structure is $1/15 \sim 1/5$ of a total number of well layer of first quantum well structures located between the at least one second quantum well structure and the second doping-type semiconductor layer 30 in the multiple first quantum well structures. The first doping-type semiconductor layer 10 is for example an N-type semiconductor layer such as N-type GaN layer, the second doping-type semiconductor layer 20 is for example a P-type semiconductor layer such as P-type GaN layer, the MQW structure layer 20 is for example an InGaN/GaN MQW structure layer, and correspondingly the first color light is blue light and the second color light is green light, but the embodiment of the disclosure does not strictly limit the materials of the first doping-type semiconductor layer 10, the MQW structure layer 20 and the second doping-type semiconductor layer 30.

The buffer layer 50 is disposed on the substrate 40. The first doping-type semiconductor layer 10, the MQW structure layer 20 and the second doping-type semiconductor layer 30 are for example sequentially epitaxially grown on a side of the buffer layer 50 facing away from the substrate 40. In exemplary embodiments, the substrate 40 is a silicon (Si) substrate, and the buffer layer 50 is for example an aluminum nitride (AlN) layer; or, the substrate 40 is a sapphire ($Al_2O_3$) substrate, and the buffer layer 50 is for example a low-temperature GaN epitaxial layer; but the embodiments of the disclosure are not limited to these. The first electrode 60 is disposed on the first doping-type semiconductor layer 10 and electrically connected to (e.g., in ohmic contact with) the first doping-type semiconductor layer 10, and the first electrode 60 is for example an N-electrode. The second electrode 70 is disposed on the second doping-type semiconductor layer 30 and electrically connected to (e.g., in ohmic contact with) the second doping-type semiconductor layer 30, and the second electrode 70 is for example a P-electrode.

In order to facilitate a clearer understanding of the light-emitting diode chip 100 of the illustrated embodiment, the first doped type semiconductor layer 10, the MQW structure layer 20 and the second doped type semiconductor layer 30 being respectively an N-type semiconductor layer, an InGaN/GaN MQW structure layer and a P-type semiconductor layer is taken as an example, and a detailed description will be given below in conjunction with multiple exemplary embodiments.

First Embodiment

Figure 2A:
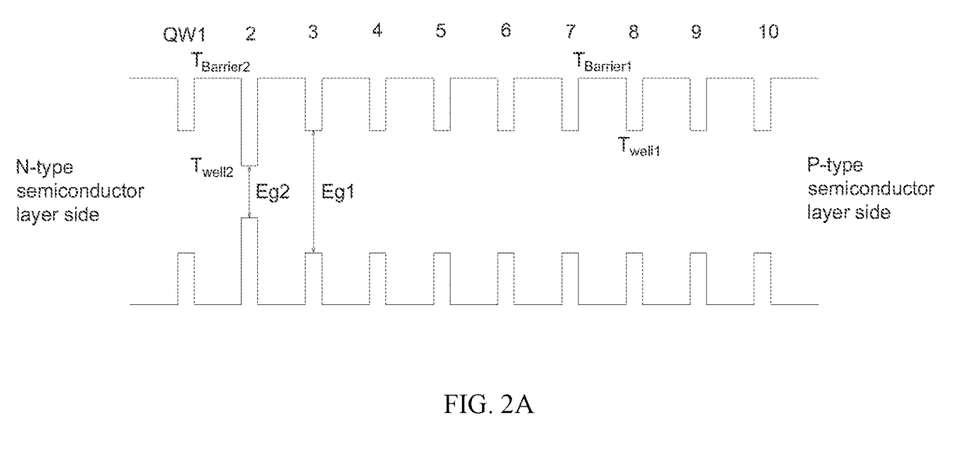
FIG. 2A is a schematic energy band diagram of a first embodiment of a MQW structure layer according to an embodiment of the disclosure.

As illustrated in FIG. 2A, the InGaN/GaN MQW structure layer in the first embodiment includes ten quantum well structures (QW1~10), i.e., one green-light quantum well structure and nine blue-light quantum well structures. Each of the ten quantum well structure uses GaN (gallium nitride) as a material of barrier layer and uses InGaN (indium gallium nitride) as a material of well layer.

The blue-light quantum well structure has a band gap being Eg1, a thickness of barrier layer being $T_{Barrier1}$, and a thickness of well layer being $T_{well1}$. The green-light quantum well structure has a band gap being Eg2, a thickness of barrier layer being $T_{Barrier2}$, and a thickness of well layer being $T_{well2}$. The band gap Eg1 is preferably 2.64~2.88 eV (electron volt), and the band gap Eg2 is preferably 2.25~2.43 eV. A value range of each of the thicknesses of barrier layers $T_{Barrier1}$ and $T_{Barrier2}$ is for example 8~12 nm, a value range of each of the thicknesses of well layers $T_{well1}$ and $T_{well2}$ is for example 2.5~4.5 nm, $T_{Barrier1}=T_{Barrier2}$, $T_{well1}$ $T_{well2}$, $T_{Barrier1}=(1\sim4)*T_{well1}$, $T_{Barrier2}=(1\sim4)*T_{well2}$. The well layer of the green-light quantum well structure has a relatively high Indium (In) concentration, and thus its energy band is deeper than that of the well layer of the blue-light quantum well structure, so that the band gap Eg2 is smaller than the band gap Eg1. Moreover, the In concentration is controlled by a growth temperature of InGaN material; the lower the growth temperature, the higher the In concentration and the longer a wavelength of excited color light, and therefore the InGaN well layer of the green-light quantum well structure has a lower growth temperature compared with the InGaN well layer of the blue-light quantum well structure. Typically, the growth temperature of the InGaN well layer of the green-light quantum well structure is lower about 25~45 Celsius degrees (° C.) than the growth temperature of the InGaN well layer of the blue-light quantum well structure, the growth temperature of about 1° C. affects a 2 nm of wavelength, and correspondingly an absolute value of a difference between peak wavelengths of emitted blue light and emitted green light is about 50~90 nm. In an exemplary embodiment, the growth temperature of the InGaN well layer of the blue-light quantum well structure is 790° C., the growth temperature of the InGaN well layer of the green-light quantum well structure is 760° C., and thus the absolute value of the difference between the peak wavelength of blue light emitted from the blue-light quantum well structure and the peak wavelength of green light emitted from the green-light quantum well structure is about 60 nm. In the first embodiment, the material of the well layer of the green-light quantum well structure may be expressed as $In_xGa_{1-x}N$, x=0.24~0.30, which corresponds to the In concentration of 24%~30%; and the material of the well layer of the blue-light quantum well structure may be expressed as $In_yGa_{1-y}N$, y=0.12~0.18, which corresponds to the In concentration of 12%~18%.

The nine blue-light quantum well structures in the first embodiment include eight blue-light quantum well structures located between the green-light quantum well structure and the P-type semiconductor layer, and one blue-light quantum well structure located between the green-light quantum well structure and the N-type semiconductor layer. The position of the green-light quantum well structure is more close to the N-type semiconductor layer than that of most of the nine blue-light quantum well structures, so that in the InGaN/GaN MQW structure layer shown in FIG. 2A, the total number of well layer of the green-light quantum well structure is ⅛ of the total number of well layer of the blue-light quantum well structures located between the green-light quantum well structure and the P-type semiconductor layer.

Figure 2B:
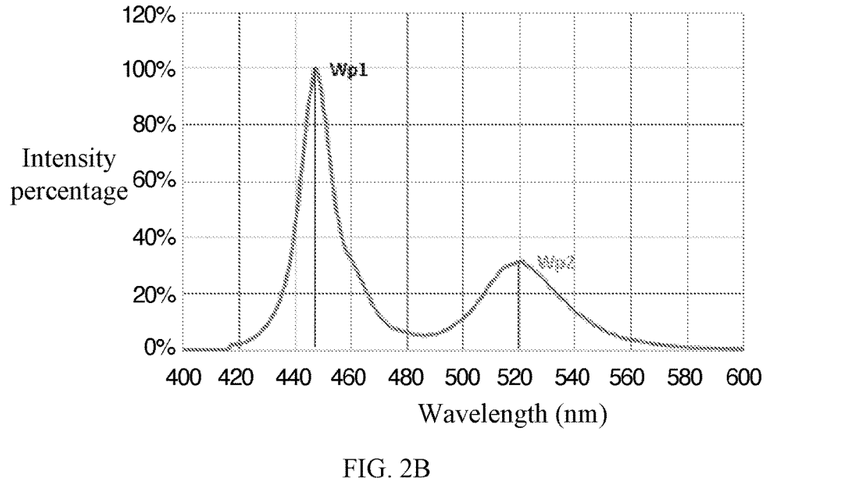
FIG. 2B is a schematic emission spectrum diagram of a light-emitting diode chip adopting the MQW structure layer shown in FIG. 2A according to an embodiment of the disclosure.

In addition, referring to FIG. 2B, an emission spectrum of the light-emitting diode chip 100 using the MQW structure layer shown in FIG. 2A has a first peak Wp1 in a blue wavelength band and a second peak Wp2 in a green wavelength band. A wavelength of the first peak Wp1 (also referred to as peak wavelength) is about 445 nanometers (nm), a wavelength of the second peak Wp2 is about 520 nm, and an absolute value of the wavelength difference between the first peak Wp1 and the second peak Wp2 is greater than 50 nm. Moreover, as seen from FIG. 2B, a full width at half maximum (FWHM) corresponding to the second peak Wp2 is larger than a FWHM corresponding to the first peak Wp1.

In summary, the first embodiment can realize that the light-emitting diode chip 100 is capable of emitting blue light and green light simultaneously, and can meet requirements such as brightness, reliability and narrow emission spectrum required by a display screen by combining with a red phosphor. Moreover, the blue-light quantum well structures and the green-light quantum well structure employ the same thickness of barrier layer, the required InGaN/GaN MQW structure layer can be prepared by controlling the epitaxial growth temperatures of InGaN, the process control is simple and the cost is low.

Second Embodiment

Figure 3:
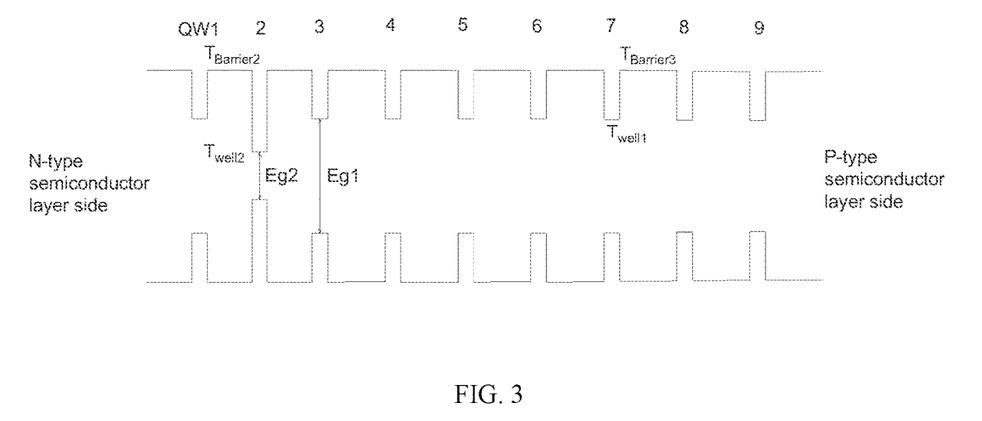
FIG. 3 is a schematic energy band diagram of a second embodiment of a MQW structure layer according to an embodiment of the disclosure.

As illustrated in FIG. 3, the InGaN/GaN MQW structure layer in the second embodiment includes nine quantum well structures (QW1~9), i.e., one green-light quantum well structure and eight blue-light quantum well structures. Each of the nine quantum well structures adopts GaN as a material of barrier, and adopts InGaN as a material of well layer.

The blue-light quantum well structure has a band gap being Eg1, a thickness of barrier layer being $T_{Barrier3}$ and a thickness of well layer being $T_{well1}$. The green-light quantum well structure has a band gap being Eg2, a thickness of barrier layer being $T_{Barrier2}$ and thickness of well layer being $T_{well2}$. The band gap Eg1 is preferably 2.64~2.88 eV, and the band gap Eg2 is preferably 2.25~2.43 eV. A value range of the thickness of barrier layer $T_{Barrier2}$ is for example 8~12 nm, a value range of the thickness of barrier layer $T_{Barrier3}$ is for example 8~15 nm, a value range of each of the thicknesses of well layers $T_{well1}$ and $T_{well2}$ is for example 2.5~4.5 nm, $T_{Barrier3} > T_{Barrier2}$, $T_{well1} = T_{well2}$.

In the illustrated embodiment, the eight blue-light quantum well structures include seven blue-light quantum well structures located between the green-light quantum well structure and the P-type semiconductor layer and one blue-light quantum well structure located between the green-light quantum well structure and the N-type semiconductor layer. The position of the green-light quantum well structure is more close to the N-type semiconductor layer than that of most of the eight blue-light quantum well structures, so that in the InGaN/GaN MQW structure layer shown in FIG. 3, the total number of well layer of the green-light quantum well structure is 1/7 of the total number of well layer of the blue-light quantum well structures located between the green-light quantum well structure and the P-type semiconductor layer.

In addition, comparing the second embodiment with the foregoing first embodiment, it can be found that, by increasing the thickness of barrier layer of the blue-light quantum well structure located between the green-light quantum well structure and the P-type semiconductor layer, i.e., increasing from $T_{Barrier1}$ to $T_{Barrier3}$, the peak intensity of green light would become relatively weaker, so that the number/amount of the blue-light quantum well structures located between the green-light quantum well structure and the P-type semiconductor layer can be reduced by one to obtain a certain peak intensity of green light. In other words, the thickness of barrier layer of the blue-light quantum well structure located at the side of the green-light quantum well structure facing towards the P-type semiconductor layer would affect the peak intensity of green light, the thicker the thickness of barrier layer of the blue-light quantum well structure, the greater the distance between the green-light quantum well structure and the P-type semiconductor layer, resulting in the peak intensity of green light becomes relatively weaker.

Third Embodiment

Figure 4A:
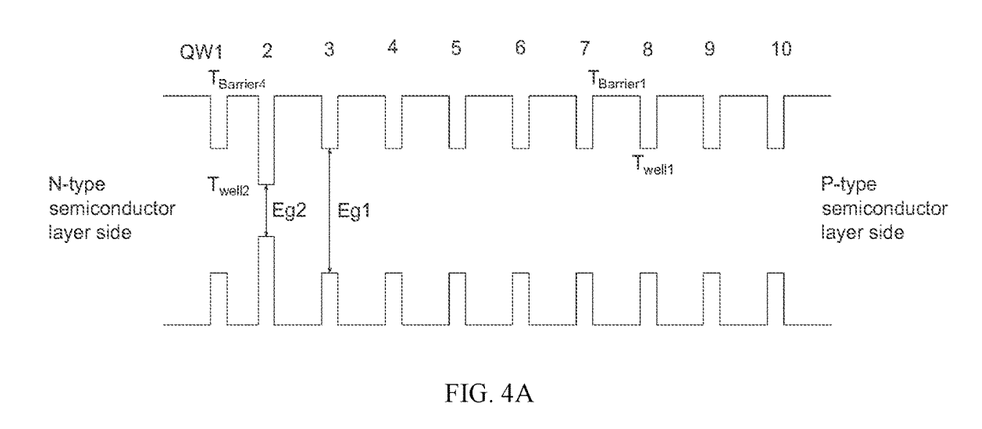
FIG. 4A is a schematic energy band diagram of a third embodiment of a MQW structure layer according to an embodiment of the disclosure.

As illustrated in FIG. 4A, the InGaN/GaN MQW structure layer in the third embodiment includes ten quantum well structures (QW1~10), i.e., one green-light quantum well structure and nine blue-light quantum well structures. Each of the ten quantum well structures adopts GaN as a material of barrier, and adopts InGaN as a material of well layer.

The blue-light quantum well structure has a band gap being Eg1, a thickness of barrier layer being $T_{Barrier1}$, and a thickness of well layer being $T_{well1}$. The green-light quantum well structure has a band gap being Eg2, a thickness of barrier layer being $T_{Barrier4}$, and thickness of well layer being $T_{well2}$. The band gap Eg1 is preferably 2.64~2.88 eV, and the band gap Eg2 is preferably 2.25~2.43 eV. A value range of the thickness of barrier layer $T_{Barrier1}$ is for example 8~12 nm, a value range of the thickness of barrier layer $T_{Barrier4}$ is for example 6~10 nm, a value range of each of the thicknesses of well layers $T_{well1}$ and $T_{well2}$ is for example 2.5~4.5 nm, $T_{Barrier4} < T_{Barrier1}$, $T_{well1} = T_{well2}$, $T_{Barrier1} = (1~4) * T_{well1}$.

In the illustrated embodiment, the nine blue-light quantum well structures include eight blue-light quantum well structures located between the green-light quantum well structure and the P-type semiconductor layer and one blue-light quantum well structure located between the green-light quantum well structure and the N-type semiconductor layer. The position of the green-light quantum well structure is more close to the N-type semiconductor layer than that of most of the nine blue-light quantum well structures, so that in the InGaN/GaN MQW structure layer shown in FIG. 4A, the total number of well layer of the green-light quantum well structure is 1/8 of the total number of well layer of the blue-light quantum well structures located between the green-light quantum well structure and the P-type semiconductor layer.

Figure 4B:
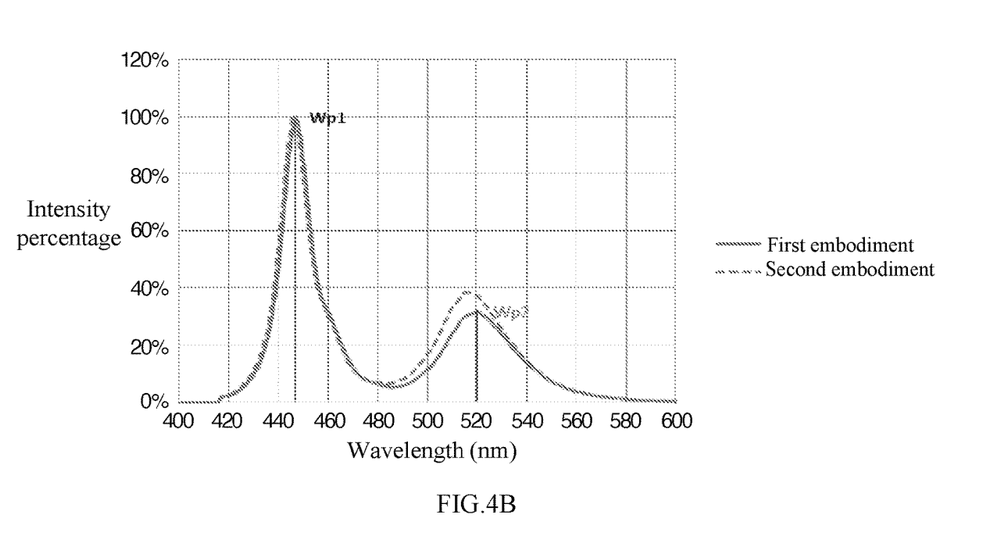
FIG. 4B is a schematic emission spectrum diagram of light-emitting diode chips respectively adopting the MQW structure layers shown in FIG. 2A and FIG. 4A according to an embodiment of the disclosure.

Moreover, referring to FIG. 4B, an emission spectrum of the light-emitting diode chip 100 adopting the MQW structure layer shown in FIG. 4A has a first peak Wp1 in a blue wavelength band and a second peak Wp2 in a green wavelength band. As denoted by dotted line in FIG. 4B, a wavelength of the first peak Wp1 (also referred to as peak wavelength) is about 445 nm, a wavelength of the second peak Wp2 is about 515 nm, and an absolute value of wavelength difference between the first peak Wp1 and the second peak Wp2 is greater than 50 nm. Moreover, as seen from FIG. 4B, a FWHM corresponding to the second peak Wp2 is larger than a FWHM corresponding to the first peak Wp1.

In addition, comparing the third embodiment with the foregoing first embodiment, it can be found that, by decreasing the thickness of barrier layer of the green-light quantum well structure, i.e., decreasing from $T_{Barrier2}$ to $T_{Barrier4}$ the peak intensity of green light would be relatively stronger, a ratio of the thickness of barrier layer being decreased and a ratio of the peak intensity of green light being increased are about the same. In other words, the thinner the thickness of barrier layer of the green-light quantum well structure, the greater/stronger the peak intensity of green light.

Fourth Embodiment

Figure 5:
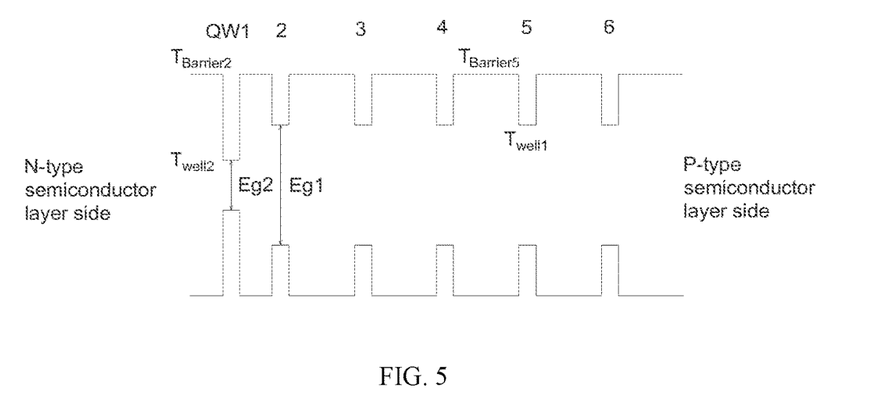
FIG. 5 is a schematic energy band diagram of a fourth embodiment of a MQW structure layer according to an embodiment of the disclosure.

As illustrated in FIG. 5, the InGaN/GaN MQW structure layer in the fourth embodiment includes six quantum well structures (QW1~6), i.e., one green-light quantum well structure and five blue-light quantum well structures. Each of the six quantum well structures adopts GaN as a material of barrier, and adopts InGaN as a material of well layer.

The blue-light quantum well structure has a band gap being Eg1, a thickness of barrier layer being $T_{Barrier5}$ and a thickness of well layer being $T_{well1}$. The green-light quantum well structure has a band gap being Eg2, a thickness of barrier layer being $T_{Barrier2}$, and thickness of well layer being $T_{well2}$ The band gap Eg1 is preferably 2.64~2.88 eV and the band gap Eg2 is preferably 2.25~2.43 eV. A value range of the thickness of barrier layer $T_{Barrier2}$ is for example 8~12 nm, a value range of the thickness of barrier layer $T_{Barrier5}$ is for example 10~40 nm, a value range of each of the thicknesses of well layers $T_{well1}$ and $T_{well2}$ is for example 2.5~4.5 nm, $T_{Barrier5} > T_{Barrier2}$, $T_{well1} = T_{well2}$.

In the illustrated embodiment, the five blue-light quantum well structures include five blue-light quantum well structures located between the green-light quantum well structure and the P-type semiconductor layer and zero blue-light quantum well structure located between the green-light quantum well structure and the N-type semiconductor layer, i.e., the closest to the N-type semiconductor layer is the green-light quantum well structure, so that in the InGaN/GaN MQW structure layer shown in FIG. 5, the total number of well layer of the green-light quantum well structure is ⅕ of the total number of well layer of the blue-light quantum well structures located between the green-light quantum well structure and the P-type semiconductor layer.

In addition, comparing the fourth embodiment with the foregoing first embodiment, it can be found that, the number of the blue-light quantum well structures located between the green-light quantum well structure and the P-type semiconductor layer is reduced, and in order to obtain a certain peak intensity of green light, the thickness of the blue-light quantum well structure located between the green-light quantum well structure and the P-type semiconductor layer is increased, i.e., increasing from $T_{Barrier1}$ to $T_{Barrier5}$.

Fifth Embodiment

Figure 6:
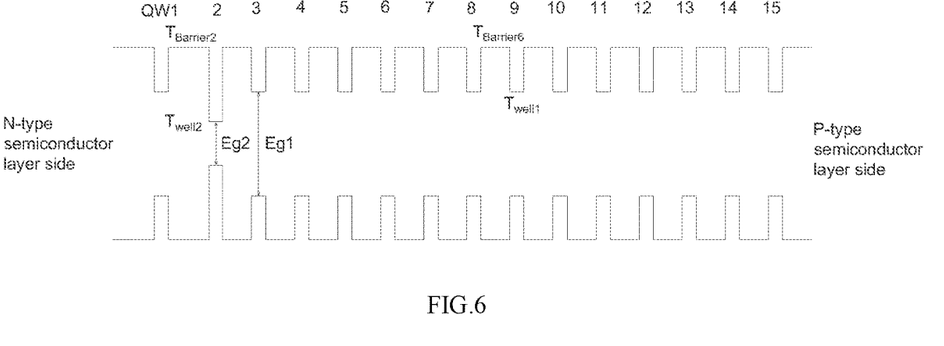
FIG. 6 is a schematic energy band diagram of a fifth embodiment of a MQW structure layer according to an embodiment of the disclosure.

As illustrated in FIG. 6, the InGaN/GaN MQW structure layer in the fifth embodiment includes fifteen quantum well structures (QW1~15), i.e., one green-light quantum well structure and fourteen blue-light quantum well structures. Each of the fifteen quantum well structures adopts GaN as a material of barrier, and adopts InGaN as a material of well layer.

The blue-light quantum well structure has a band gap being Eg1, a thickness of barrier layer being $T_{Barrier6}$, and a thickness of well layer being $T_{well1}$. The green-light quantum well structure has a band gap being Eg2, a thickness of barrier layer being $T_{Barrier2}$, and thickness of well layer being $T_{well2}$ The band gap Eg1 is preferably 2.64~2.88 eV, and the band gap Eg2 is preferably 2.25~2.43 eV. A value range of the thickness of barrier layer $T_{Barrier2}$ is for example 8~12 nm, a value range of the thickness of barrier layer $T_{Barrier6}$ is for example 4~10 nm, a value range of each of the thicknesses of well layers $T_{well1}$ and $T_{well2}$ is for example 2.5~4.5 nm, $T_{Barrier6} < T_{Barrier2}$, $T_{well1} = T_{well2}$.

In the illustrated embodiment, the fourteen blue-light quantum well structures include thirteen blue-light quantum well structures located between the green-light quantum well structure and the P-type semiconductor layer and one blue-light quantum well structure located between the green-light quantum well structure and the N-type semiconductor layer. The position of the green-light quantum well structure is more close to the N-type semiconductor layer with respect to most of the fourteen blue-light quantum well structures, so that in the InGaN/GaN MQW structure layer shown in FIG. 6, the total number of well layer of the green-light quantum well structure is 1/13 of the total number of well layer of the blue-light quantum well structures located between the green-light quantum well structure and the P-type semiconductor layer.

In addition, comparing the fifth embodiment with the foregoing first embodiment, it can be found that, the number/amount of the blue-light quantum well structures located between the green-light quantum well structure and the P-type semiconductor layer is increased, and in order to obtain a certain peak intensity of green light, the thickness of barrier layer of the blue-light quantum well structure located between the green-light quantum well structure and the P-type semiconductor layer is reduced, i.e., reducing from $T_{Barrier1}$ to $T_{Barrier6}$. In other words, the thinner the thickness of barrier layer of the blue-light quantum well structure located between the green-light quantum well structure and the P-type semiconductor layer and the closer the green-light quantum well structure is to the P-type semiconductor layer, the stronger/greater the peak intensity of green light; the more the number of the blue-light quantum well structures located between the green-light quantum well structure and the P-type semiconductor layer and the farther the green-light quantum well structure is from the P-type semiconductor layer, the weaker the peak intensity of green light.

Sixth Embodiment

Figure 7:
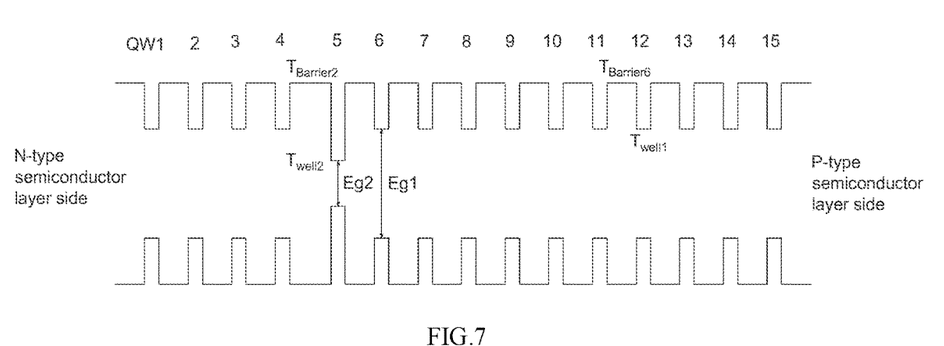
FIG. 7 is a schematic energy band diagram of a sixth embodiment of a MQW structure layer according to an embodiment of the disclosure.

As illustrated in FIG. 7, the InGaN/GaN MQW structure layer in the sixth embodiment includes fifteen quantum well structures (QW1~15), i.e., one green-light quantum well structure and fourteen blue-light quantum well structures. Each of the fifteen quantum well structures adopts GaN as a material of barrier, and adopts InGaN as a material of well layer.

The blue-light quantum well structure has a band gap being Eg1, a thickness of barrier layer being $T_{Barrier6}$, and a thickness of well layer being $T_{well1}$. The green-light quantum well structure has a band gap being Eg2, a thickness of barrier layer being $T_{Barrier2}$, and a thickness of well layer being $T_{well2}$. The band gap Eg1 is preferably 2.64~2.88 eV, and the band gap Eg2 is preferably 2.25~2.43 eV. A value range of the thickness of barrier layer $T_{Barrier2}$ is for example 8~12 nm, a value range of the thickness of barrier layer $T_{Barrier6}$ is for example 4~10 nm, a value range of each of the thicknesses of well layers $T_{well1}$ and $T_{well2}$ is for example 2.5~4.5 nm, $T_{Barrier6} < T_{Barrier2}$, $T_{well1} = T_{well2}$.

In the illustrated embodiment, the fourteen blue-light quantum well structures include ten blue-light quantum well structures located between the green-light quantum well structure and the P-type semiconductor layer and four blue-light quantum well structures located between the green-light quantum well structure and the N-type semiconductor layer. The position of the green-light quantum well structure is more close to the N-type semiconductor layer than that of most of the fourteen blue-light quantum well structures, so that in the InGaN/GaN MQW structure layer shown in FIG. 7, the total number of well layer of the green-light quantum well structure is 1/10 of the total number of well layer of the blue-light quantum well structures located between the green-light quantum well structure and the P-type semiconductor layer.

In addition, comparing the sixth embodiment with the foregoing first embodiment, it can be found that, the peak intensity of green light would become relatively weaker when the number of blue quantum well structures is relatively larger, and in order to obtain a certain peak, the thickness of barrier layer of the blue-light quantum well structure between the green-light quantum well structure and the P-type semiconductor layer is reduced, i.e., reducing from $T_{Barrier1}$ to $T_{Barrier6}$ and the position of the green-light quantum well structure is adjusted towards the P-type semiconductor layer.

Seventh Embodiment

Figure 8:
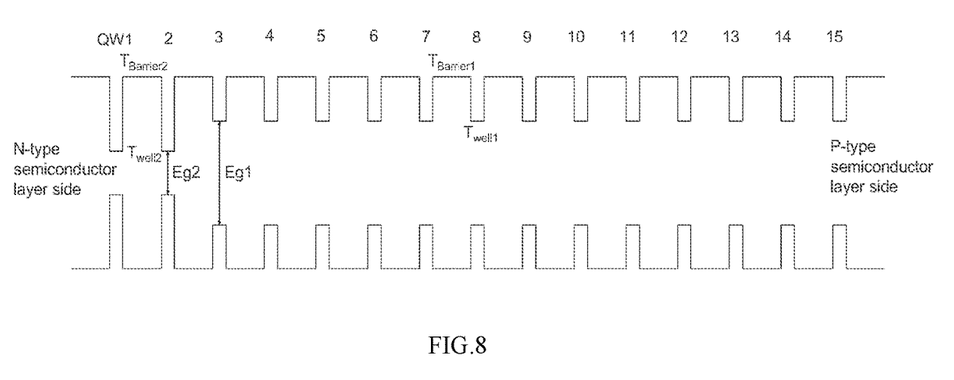
FIG. 8 is a schematic energy band diagram of a seventh embodiment of a MQW structure layer according to an embodiment of the disclosure.

As illustrated in FIG. 8, the InGaN/GaN MQW structure layer in the seventh embodiment includes fifteen quantum well structures (QW1~15), i.e., two green-light quantum well structures and thirteen blue-light quantum well structures. Each of the fifteen quantum well structures adopts GaN as a material of barrier, and adopts InGaN as a material of well layer.

The blue-light quantum well structure has a band gap being Eg1, a thickness of barrier layer being $T_{Barrier1}$, and a thickness of well layer being $T_{well1}$. The green-light quantum well structure has a band gap being Eg2, a thickness of barrier layer being $T_{Barrier2}$, and a thickness of well layer being $T_{well2}$. The band gap Eg1 is preferably 2.64~2.88 eV, and the band gap Eg2 is preferably 2.25~2.43 eV. A value range of each of the thicknesses of barrier layers $T_{Barrier1}$ and $T_{Barrier2}$ is for example 8~12 nm, a value range of each of the thicknesses of well layers $T_{well1}$ and $T_{well2}$ is for example 2.5~4.5 nm, $T_{Barrier1}=T_{Barrier2}$, $T_{well1}=T_{well2}$.

In the illustrated embodiment, the thirteen blue-light quantum well structures include thirteen blue-light quantum well structures located between the green-light quantum well structures and the P-type semiconductor layer and zero blue-light quantum well structure located between the green-light quantum well structures and the N-type semiconductor layer, the closest to the N-type semiconductor layer is the green-light quantum well structure, and the two green-light quantum well structures are stacked and arranged adjacent to each other in the distance direction between the N-type semiconductor layer and the P-type semiconductor layer, so that in the InGaN/GaN MQW structure layer shown in FIG. 8, the total number of well layer of the green-light quantum well structures is $2/13$ of the total number of well layer of the blue-light quantum well structures located between the green-light quantum well structures and the P-type semiconductor layer.

In addition, comparing the seventh embodiment with the foregoing first embodiment, it can be found that, by increasing the number/amount of the green-light quantum well structure, the peak intensity of green light would become relatively stronger, and in order to obtain a certain ratio of the peak intensity of green light to the peak intensity of blue light, more blue-light quantum well structures need to be set between the green-light quantum well structures and the P-type semiconductor layer to increase the peak intensity of blue light.

Figure 9:
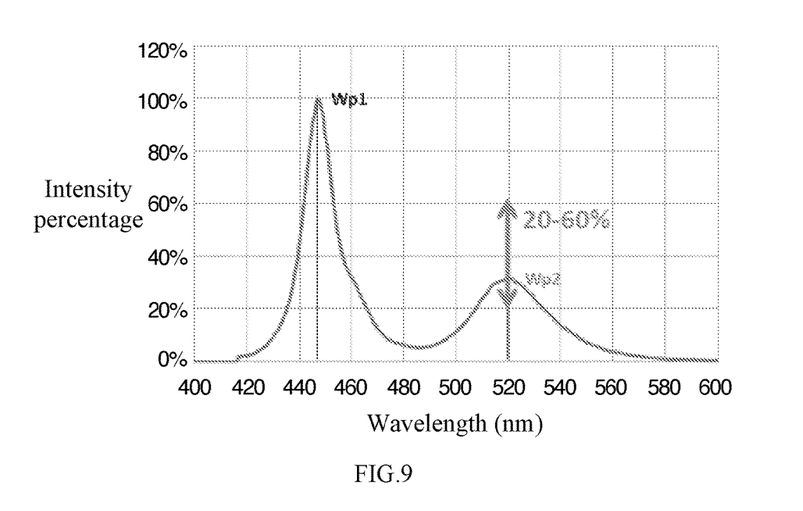
FIG. 9 is a schematic emission spectrum diagram of a light-emitting diode chip according to an embodiment of the disclosure, showing a ratio relationship of a peak intensity of green light to a peak intensity of blue light.

It can be seen from the foregoing illustrative first to seventh embodiments that, based on designs of the numbers of well layers and/or the thicknesses of barrier layers of multiple first quantum well structures (e.g., blue-light quantum well structures) for emitting the first color light and at least one second quantum well structure (e.g., green-light quantum well structure(s)) for emitting the second color light, and/or of the position of the at least one second quantum well structure, the embodiments of the disclosure each can make the light-emitting diode chip 100 emit multiple e.g., two kinds of color lights of different peak wavelengths (such as blue light and green light) simultaneously. Moreover, a ratio of the peak intensities of the two different color lights is preferably 20%~60%, for example the illustration of FIG. 9, a ratio of the peak intensity of green light to the peak intensity of blue light is 20%~60%. Furthermore, value ranges of respective peak wavelengths of the two different color lights are for example 430~470 nm and 510~550 nm, and an absolute value of a difference between the peak wavelengths is greater than 50 nm. In addition, the position and the number of well layer of the at least one second quantum well structure have a great influence on the peak intensity of the second color light, for example the farther the position of the second quantum well structure is from the second doping-type semiconductor layer (e.g., P-type semiconductor layer), the weaker the peak intensity of the second color light; the more the number of well layer of the at least one second quantum well structure, the stronger/greater the peak intensity of the second color light. In term of the thicknesses of barrier layers, the thinner the thickness of barrier layer of the second quantum well structure, the stronger the peak intensity of the second color light; the thinner the thickness of barrier layer of the first quantum well structure located between the second quantum well structure and the second doping-type semiconductor layer, the closer the second quantum well structure is to the second doping-type semiconductor layer (e.g., P-type semiconductor layer) and thus the stronger the peak intensity of the second color light.

Sum up, In the embodiments of the disclosure, the MQW structure layer is designed with the quantum well structures of different band gaps, that is, multiple first quantum well structures and at least one second quantum well structure stacked in the distance direction between the first doping-type semiconductor layer and the second doping-type semiconductor layer, and the total number of well layer of the at least one second quantum well structure is set to be $1/15~1/5$ of the total number of well layer of the first quantum well structures located between the at least one second quantum well structure and the second doping-type semiconductor layer. As a result, the light-emitting diode chip of any one of the embodiments of the disclosure can emit multiple e.g., two kinds of color lights of different wavelengths simultaneously, for example emit blue light and green light simultaneously. Moreover, the blue light and the green light combined with a red phosphor can meet requirements such as brightness, reliability and narrow emission spectrum required by a display screen. In addition, it is noted that, for the case of multiple second quantum well structures (e.g., multiple green-light quantum well structures) being equipped with, the second quantum well structures are not limited to be stacked and arranged adjacent to each other as shown in FIG. 8, and can be stacked and spaced from each other instead. Furthermore, the thickness of well layer of the first quantum well structure and the thickness of well layer of the second quantum well structure may be not equal to each other.

In addition, it can be understood that the embodiments mentioned above are only illustrative description of the disclosure, and the technical solutions of the embodiments can be arbitrarily combined and used together on the premise that the technical features are not conflicting, the structures are not contradictory, and the inventive purpose of the disclosure is not violated.

Finally, it should be noted that the above embodiments are only used to illustrate the technical solutions of the disclosure, rather than to limit the disclosure. Although the disclosure has been described in detail with reference to the foregoing embodiments, those of ordinary skill in the art should understand that the technical solutions illustrated in the foregoing embodiments may be modified, or some of the technical features may be equivalently substituted. These modifications or substitutions do not make the essence of corresponding technical solutions deviate from the spirit and scope of the technical solutions of various embodiments of the disclosure.

What is claimed is:
1. A light-emitting diode chip, comprising:
a first doping-type semiconductor layer;
a second doping-type semiconductor layer; and a MQW (multiple quantum well) structure layer, formed between the first doping-type semiconductor layer and the second doping-type semiconductor layer;

wherein the MQW structure layer comprises a plurality of first quantum well structures and at least one second quantum well structure stacked in a distance direction between the first doping-type semiconductor layer and the second doping-type semiconductor layer, the plurality of first quantum well structures are configured to emit first color light, the at least one second quantum well structure is configured to emit second color light different from the first color light, the plurality of first quantum well structures comprise: first quantum well structures located between the at least one second quantum well structure and the second doping-type semiconductor layer, and a total number of well layer of the at least one second quantum well structure is $1/15$ to $1/5$ of a total number of well layer of the first quantum well structures located between the at least one second quantum well structure and the second doping-type semiconductor layer in the plurality of first quantum well structures.

2. The light-emitting diode chip according to claim 1, wherein the first doping-type semiconductor layer is an N-type semiconductor layer, the second doping-type semiconductor layer is a P-type semiconductor layer, the plurality of first quantum well structures are a plurality of blue-light quantum well structures and configured to emit blue light, and the at least one second quantum well structure is at least one green-light quantum well structure and configured to emit green light.

3. The light-emitting diode chip according to claim 2, wherein an emission spectrum of the light-emitting diode chip comprises a first peak in a blue wavelength band and a second peak in a green wavelength band, an intensity of the second peak is 20% to 60% of an intensity of the first peak, a wavelength of the first peak is in a range of 430 to 470 nm, and a wavelength of the second peak is in a range of 510 to 550 nm.

4. The light-emitting diode chip according to claim 2, wherein for each of the at least one green-light quantum well structure, a thickness of barrier layer is 1 to 4 times of a thickness of well layer; and for each of the plurality of blue-light quantum well structures, a thickness of barrier layer is 1 to 4 times of a thickness of well layer.

5. The light-emitting diode chip according to claim 2, wherein a thickness of well layer of each of the at least one green-light quantum well structure is equal to a thickness of well layer of each of the plurality of blue-light quantum well structures, and a thickness of barrier layer of each of the at least one green-light quantum well structure is equal to a thickness of barrier layer of each of the plurality of blue-light quantum well structures.

6. The light-emitting diode chip according to claim 2, wherein a thickness of barrier of each of at least one of blue-light quantum well structures located between the at least one green-light quantum well structure and the P-type semiconductor layer in the plurality of blue-light quantum well structures is greater than a thickness of barrier layer of each of the at least one green-light quantum well structure.

7. The light-emitting diode chip according to claim 2, wherein a thickness of barrier of each of at least one of blue-light quantum well structures located between the at least one green-light quantum well structure and the P-type semiconductor layer in the plurality of blue-light quantum well structures is smaller than a thickness of barrier layer of each of the at least one green-light quantum well structure.

8. The light-emitting diode chip according to claim 2, wherein the at least one green-light quantum well structure is a plurality of green-light quantum well structures, and the plurality of green-light quantum well structures are stacked and arranged adjacent to each other in the distance direction; and one of the plurality of green-light quantum well structures is in direct contact with the N-type semiconductor layer.

9. The light-emitting diode chip according to claim 1, wherein a band gap of each of the plurality of first quantum well structures is in a range of 2.64 to 2.88 eV, a band gap of each of the at least one second quantum well structure is in a range of 2.25 to 2.43 eV, a peak wavelength of the first color light is smaller than a peak wavelength of the second color light, and a peak intensity of the first color light is greater than a peak intensity of the second color light.

10. The light-emitting diode chip according to claim 1, wherein the plurality of first quantum well structures further comprise: first quantum well structures located between the at least one second quantum well structure and the first doping-type semiconductor layer; and wherein the total number of well layer of the first quantum well structures located between the at least one second quantum well structure and the second doping-type semiconductor layer is greater than a total number of well layer of the first quantum well structures located between the at least one second quantum well structure and the first doping-type semiconductor layer.

11. A light-emitting diode chip, comprising: a multiple quantum well structure formed between an N-type semiconductor layer and an P-type semiconductor layer, an emission spectrum of the light-emitting diode chip comprises a first peak having a wavelength in a range of 430 to 470 nm and a second peak having a wavelength in a range of 510 to 550 nm, and an intensity of the second peak is 20% to 60% of an intensity of the first peak;

wherein the multiple quantum well structure comprises: a plurality of first quantum wells and at least one second quantum well different in indium concentrations, and the plurality of first quantum wells comprise: first quantum wells located between the at least one second quantum well and the P-type semiconductor layer and first quantum wells located between the at least one second quantum well and the N-type semiconductor layer;

wherein a total layer number of the at least one second quantum well is $1/15$ to $1/5$ of a total layer number of the first quantum wells located between the at least one second quantum well and the P-type semiconductor layer; and wherein the total layer number of the first quantum wells located between the at least one second quantum well and the P-type semiconductor layer is greater than a total layer number of the first quantum wells located between the at least one second quantum well and the N-type semiconductor layer.

12. The light-emitting diode chip according to claim 11, wherein an absolute value of a wavelength difference between the first peak and the second peak is 50 to 90 nm.

13. The light-emitting diode chip according to claim 11, wherein the indium concentration of each of the at least one second quantum well is greater than the indium concentration of each of the plurality of first quantum wells.

14. The light-emitting diode chip according to claim 13, wherein the indium concentration of each of the plurality of first quantum wells is 12% to 18%, and the indium concentration of each of the at least one second quantum well is 24% to 30%.

15. The light-emitting diode chip according to claim 13, wherein the at least one second well layer is closer to the N-type semiconductor layer than to the P-type semiconductor layer.

16. The light-emitting diode chip according to claim 13, wherein a number of the at least one second quantum well is less than that of the plurality of first quantum wells.

17. The light-emitting diode chip according to claim 11, wherein a full width at half maximum (FWHM) corresponding to the second peak is larger than a FWHM corresponding to the first peak.

* * * * *